(12) United States Patent
Kim

(10) Patent No.: US 9,293,621 B2
(45) Date of Patent: Mar. 22, 2016

(54) SYSTEM FOR GENERATING PHOTOVOLTAIC POWER

(75) Inventor: Yong Taek Kim, Seongnam-si (KR)

(73) Assignee: Kepco Engineering & Construction Company, Inc., Yongin-Si (KR)

( * ) Notice: Subject to any disclaimer, the term of this patent is extended or adjusted under 35 U.S.C. 154(b) by 11 days.

(21) Appl. No.: 14/356,876

(22) PCT Filed: Jul. 13, 2012

(86) PCT No.: PCT/KR2012/005553
§ 371 (c)(1),
(2), (4) Date: May 7, 2014

(87) PCT Pub. No.: WO2013/069874
PCT Pub. Date: May 16, 2013

(65) Prior Publication Data
US 2014/0338725 A1    Nov. 20, 2014

(30) Foreign Application Priority Data

Nov. 7, 2011 (KR) ........................ 10-2011-0115385

(51) Int. Cl.
*H01L 31/042* (2014.01)
*H01L 31/052* (2014.01)
*H01L 31/054* (2014.01)

(52) U.S. Cl.
CPC ........ *H01L 31/0524* (2013.01); *H01L 31/0525* (2013.01); *H01L 31/0543* (2014.12); *H01L 31/0547* (2014.12); *Y02E 10/52* (2013.01)

(58) Field of Classification Search
CPC ............ H01L 31/0524; H01L 31/0543; H01L 31/0547; H01L 31/0525; Y02E 10/52
USPC .......................................... 136/246
See application file for complete search history.

(56) References Cited

U.S. PATENT DOCUMENTS

| 4,411,490 A * | 10/1983 | Daniel .................. 126/648 |
| 2008/0023060 A1 | 1/2008 | Grumazescu |
| 2009/0032085 A1 | 2/2009 | Grumazescu |
| 2009/0032102 A1 | 2/2009 | Chen et al. |
| 2009/0277224 A1 | 11/2009 | Angel et al. |

FOREIGN PATENT DOCUMENTS

| CN | 101546032 A | 9/2009 |
| CN | 101630696 A | 1/2010 |
| CN | 102062938 A | 5/2011 |

(Continued)

OTHER PUBLICATIONS

International Search Report and Written Opinion in International Application No. PCT/KR2012/005553, mailed Jan. 2, 2013.

(Continued)

*Primary Examiner* — Tamir Ayad
(74) *Attorney, Agent, or Firm* — Nixon Peabody LLP

(57) ABSTRACT

The present invention relates to a system for generating photovoltaic power. The system for generating photovoltaic power is characterized by including: a light collection part shaped like a dome bulged outward and having a light condenser lens unit for condensing incident light rays; a light diffusion part having a light diffusion lens unit for diffusing the light rays collected by the light collection part; and a solar panel for receiving the light rays diffused by the light diffusion part.

7 Claims, 6 Drawing Sheets

(56) References Cited

FOREIGN PATENT DOCUMENTS

| | | |
|---|---|---|
| CN | 201994880 U | 9/2011 |
| EP | 2 200 094 A2 | 6/2010 |
| EP | 2 221 881 A1 | 8/2010 |
| JP | 2003-258291 | 9/2003 |
| JP | 2009-37242 | 2/2009 |
| JP | 2009-037242 | 2/2009 |
| KR | 10-2004-0081515 | 9/2004 |
| KR | 10-2011-0041706 | 4/2011 |
| KR | 10-2011-0087134 | 8/2011 |
| KR | 10-2011-0104487 | 9/2011 |
| WO | 2009/066720 A1 | 5/2009 |
| WO | 2010/065794 | 6/2010 |

OTHER PUBLICATIONS

Office Action issued in JP Patent Application No. 2014-539863 dated Mar. 24, 2015, including English translation, 6 pages total.

Extended European Search Report for European Application No. 12847515.9, dated Jun. 3, 2015, 7 pages.

First Office Action, dated Dec. 23, 2015, issued in Chinese Patent Application No. 201280054637.8, 12 pages.

* cited by examiner

SYSTEM FOR GENERATING PHOTOVOLTAIC POWER

TECHNICAL FIELD

The present invention relates to a system for generating photovoltaic power, and more particularly to a system for generating photovoltaic power with improved light collection efficiency which can be erected vertically to enhance spatial availability.

BACKGROUND ART

Recently various sources of alternative energy have been developed for environment-friendly energy resources, and photovoltaic power generation is one of those which call attention. Photovoltaic power generation has an advantage in eliminating the fueling cost affecting the unit price of power generation. However, photovoltaic power generation requires the cost for construction site, installation, maintenance and repair, which also significantly affects the unit price of power generation.

Conventionally photovoltaic power generation has been achieved by arranging in a given range the solar panels for collecting light rays to generate power. Specifically, the solar panels have been arranged in a single layer over a wide area. They are used in a large scale in a desert and a salt farm region, or in a small scale on the roof of a building.

Such a conventional method suffers a limitation in collecting light rays owing to the planar type solar panels. For example, Korean Laid-Open Patent Publication No. 2011-0087134 (Laid-Open Number) discloses a planar type solar panel. Moreover, the single layer arrangement of the conventional method suffers a disadvantage in paying a high cost to obtain a site for constructing a photovoltaic power generation facility.

DETAILED DESCRIPTION OF THE INVENTION

Object of the Invention

The present invention has been conceived in order to resolve such conventional problems, and an object of the present invention is to provide a system for generating photovoltaic power which increases the efficiency of collecting light rays, and enables solar panels to be arranged in vertical layers so as to enhance spatial availability, thereby maximizing the efficiency of photovoltaic power generation.

Effects of the Invention

A system for generating photovoltaic power according to the present invention increases the efficiency of collecting light rays, and maximizes efficiency of photovoltaic power generation by means of the enhanced spatial availability enabling the solar panels to be arranged in vertical layers.

BEST MODES FOR CARRYING OUT THE PRESENT INVENTION

In order to resolve the above mentioned problems, a system for generating photovoltaic power according to the present invention is characterized by including: a light collection part shaped like a dome bulged outward and having a light condenser lens unit for condensing incident light rays; a light diffusion part having a light diffusion lens unit for diffusing the light rays collected by the light collection part; and a solar panel for receiving the light rays diffused by the light diffusion part.

Furthermore, the light condenser lens unit is preferably a convex lens or Fresnel lens formed in the inner surrounding surface of the light collection part.

Furthermore, the light condenser lens unit is a convex lens or Fresnel lens formed in the outer surrounding surface of the light collection part.

Furthermore, the light diffusion lens unit is one selected from a group of concave lens, prism lens and rod lens.

Furthermore, a cover part is preferably arranged between the light collection part and the light diffusion part so as to prevent the light rays collected by the light collection part from escaping outward.

Furthermore, a first reflection plate is preferably arranged between the light collection part and the light diffusion part so as to reflect the light rays collected by the light collection part toward the light diffusion part.

Furthermore, a second reflection plate is preferably arranged between the light diffusion part and the solar panel so as to reflect the light rays coming through the light diffusion part.

Furthermore, the system further includes preferably a support plate for supporting the solar panel, a first support column extended upward from the support plate, and a second support column extended downward from the support plate, the second support column being formed to have an internal cavity for receiving and supporting the first support column.

Preferred Embodiments of the Invention

Preferred embodiments of the present invention are described in detail with reference to the attached drawings.

Figure 1:
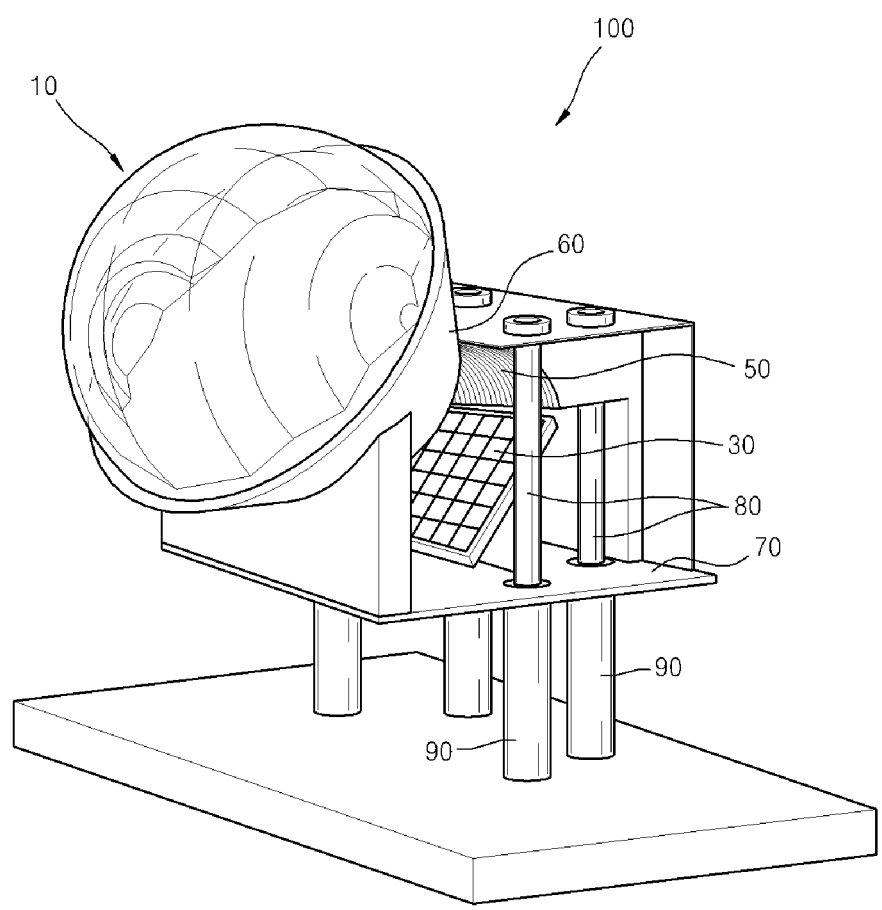
FIG. 1 is a perspective view of a system for generating photovoltaic power according to an embodiment of the present invention.
Figure 2:
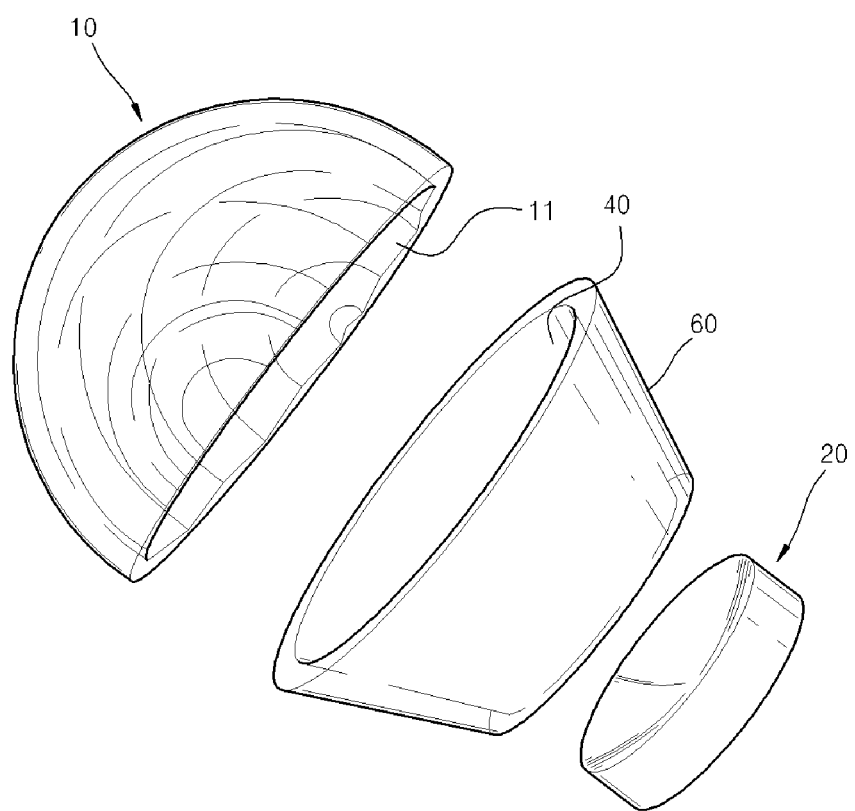
FIG. 2 is a split perspective view of FIG. 1.
Figure 3:
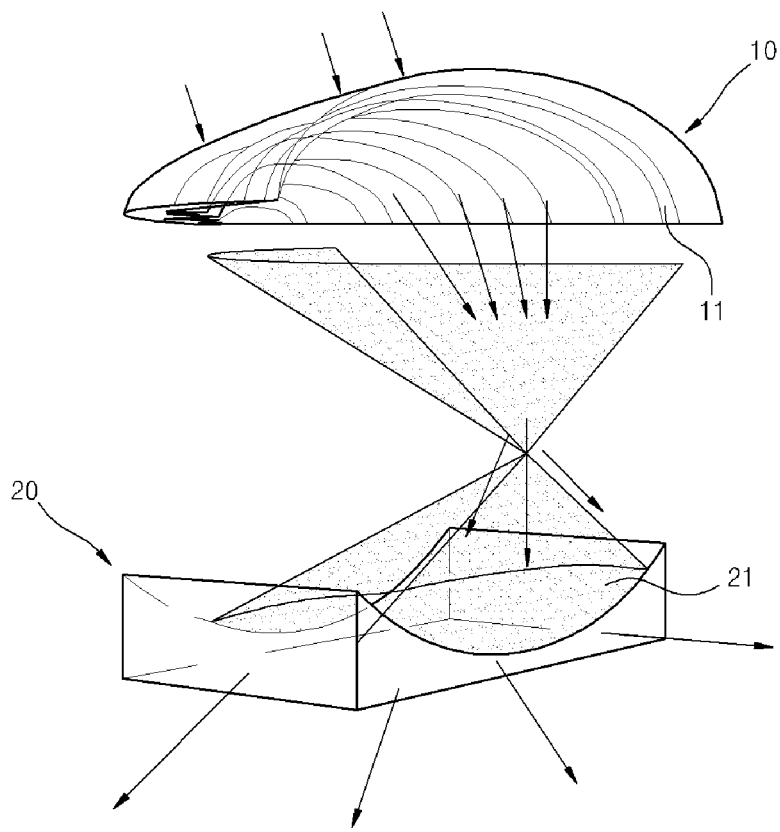
FIG. 3 is a diagrammatic cross-sectional view of a system for generating photovoltaic power according to an embodiment of the present invention.
Figure 4:
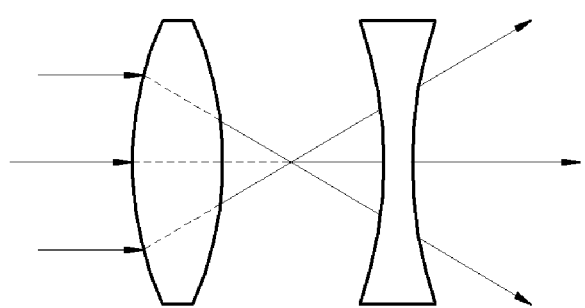
FIG. 4 is a conceptual view of collecting and diffusing light rays.

FIG. 1 is a perspective view of a system for generating photovoltaic power according to an embodiment of the present invention, FIG. 2 a split perspective view of FIG. 1, and FIG. 3 a diagrammatic cross-sectional view of a system for generating photovoltaic power according to an embodiment of the present invention. FIG. 4 is a conceptual view of collecting and diffusing light rays, FIG. 5 a view for illustrating the solar panels vertically arranged in a system for generating photovoltaic power according to an embodiment of the present invention, and FIG. 6 a view for illustrating an application of a system for generating photovoltaic power according to an embodiment of the present invention.

Firstly, referring to FIGS. 1 to 3, a system for generating photovoltaic power according to an embodiment of the present invention includes a light collection part 10, a light diffusion part 20, and a solar panel 30.

The light collection part 10 collects light rays. The light collection part 10 has a surface area large enough for the solar panel 30 to collect sufficient light rays over an ordinary light amount (1-sun). The light collection part 10 is shaped like a dome bulged outward having a light condenser lens unit 11 for condensing incident light rays.

As shown in FIG. 3, the light condenser lens unit 11 according to the embodiment is a convex lens or Fresnel lens formed in the inner surrounding surface of the light collection part 10.

Specifically, the light condenser lens unit 11 may be a single convex lens serving as the whole inner surrounding surface of the light collection part 10, or consist of a plurality of curved convex lenses. Namely, a plurality of small convex lenses may be combined on the inner surrounding surface of the light collection part 10 so as to form the single light condenser lens unit 11.

The Fresnel lens (Fresnel prism lens or Fresnel convex sphere lens) is a kind of convex lens. The shape of the Fresnel lens may be variously formed suitable for collecting light rays. The characteristics of the Fresnel lens are well-known in the art, and thus detailed description thereof is omitted. In conclusion, the light collection part 10 is to collect light rays by using a convex lens.

Figure 7:
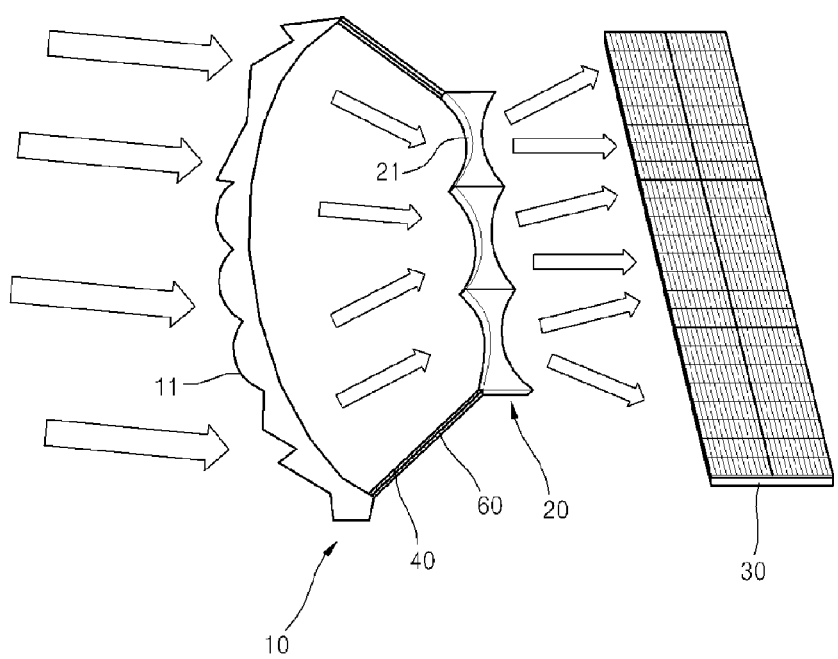
FIG. 7 is a cross-sectional view of a system for generating photovoltaic power according to another embodiment of the present invention.

Referring to FIG. 7, the light condenser lens unit 11 may be a convex lens or Fresnel lens formed on the outer surrounding surface of the light collection part 10. The forming of the convex lens or Fresnel lens on the outer surrounding surface of the light collection part 10 may be achieved in the same way as their forming on the inner surrounding surface of the light collection part 10.

For one thing, if the light condenser lens unit 11 is formed on the inner surrounding surface of the light collection part 10 shaped like a dome, and the outer surrounding surface is designed as a smoothly curved surface, the maintenance and repair of the outer surrounding surface becomes easy after constructing the photovoltaic power generating facility.

The maintenance and repair of the photovoltaic power generation facility requires a considerably large amount of cost. Thus, if the light condenser lens unit 11 is formed on the outer surrounding surface, the maintenance thereof becomes difficult because of excessive consumption of time and cost for cleaning the outer surrounding surface, etc.

The light diffusion part 20 is to diffuse the light rays collected by the light collection part 10. The light diffusion part 20 is arranged so as to diffuse the collected solar energy toward the solar panel 30.

The light diffusion part 20 has a light diffusion lens unit 21 to diffuse the light rays collected by the light collection part 10. The light diffusion lens 21 may be a concave lens, prism lens or rod lens.

The shape of the concave lens, prism lens or rod lens may be variously formed enough to receive the light rays. The characteristics of the prism and the rod lens are well-known in the art, and so the specific description thereof is omitted.

As shown in FIG. 3, the light diffusion lens unit 21 according to the present embodiment consists of a concave lens. In the present embodiment, the light diffusion lens unit 21 is made concave in the surface facing the light condenser lens unit 11. The light diffusion lens unit 21 and the light condenser lens unit 11 are separated from each other by a space amounting to the sum of the focal lengths of both lenses.

Meanwhile, referring to FIG. 7, another embodiment of the light diffusion lens unit 21 is shown, which consists of a plurality of concave lenses to form a single light diffusion part 20.

As shown in FIG. 7, the light diffusion lens unit 21 may have both surfaces made concave. As a result, the light diffusion part 20 is provided with the light diffusion lens unit 21 to diffuse the light rays collected by the light collection part 10 toward the solar panel 30.

FIG. 4 illustrates diagrammatically the paths of the light rays coming in through the light collection part 10 and the light diffusion part 20. The light collection part 10 shaped like a dome can collect the incident light rays in a wide range.

The Fresnel lens even with a constant thickness has a good performance for collecting the light rays. The light incident rays on the light collection part 10 are refracted in respective directions toward the light diffusion part 20 so as to be sufficiently delivered to the light diffusion part 20 regardless of the sun's position.

The light rays collected by the light collection part 10 are diffused through the light diffusion part 20 and transferred to the solar panel 30. Hence, compared to a planar type light collection part, the light collection part 10 of the present invention enables the light collection in a wider range, while the light diffusion part 20 diffuses widely the light rays, so that the surface area performing the photovoltaic power generation is considerably increased, thus enhancing the efficiency of generating the photovoltaic power.

The solar panel 30 receives the light rays diffused through the light diffusion part 20 to generate the photovoltaic power. The specific structure of the solar panel 30 is well-known in the art, and so the detailed description thereof is omitted.

Figure 8:
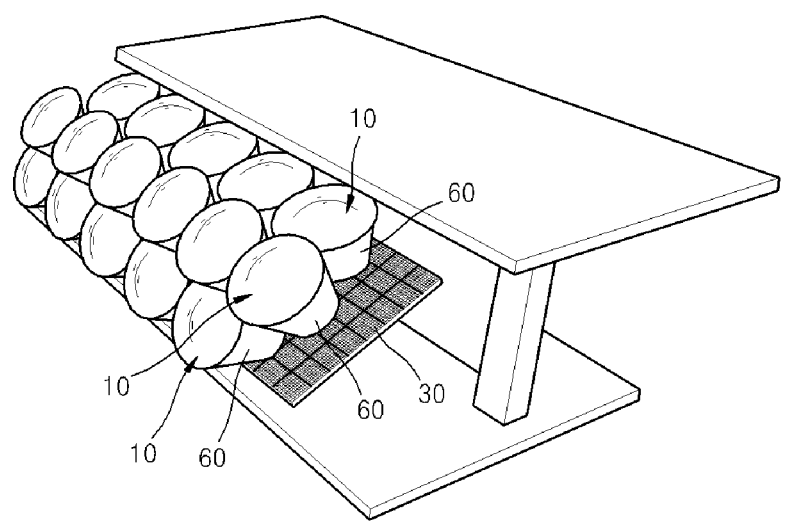
FIG. 8 is a conceptual view of a system for generating photovoltaic power according to yet another embodiment of the present invention.

Referring to FIGS. 1 to 3, the solar panel 30 of the present embodiment is arranged per light diffusion part 20 in order to receive the light rays diffused by the light diffusion part 20. Of course, as shown in FIG. 8, the solar panel 30 may be made with a large size to receive the light rays diffused by a plurality of light diffusion parts 20.

A system for generating photovoltaic power according to an embodiment of the present invention includes a cover part 60, a first reflection plate 40, a second reflection plate 50, a support plate 70, and a first and a second support column 80, 90.

As shown in FIG. 2, the cover part 60 is arranged between the light collection part 10 and the light diffusion part 20 so as to prevent the light rays collected by the light collection part 10 from escaping outward. The space between the light collection part 10 and the light diffusion part 20 is sealed by the cover part 60.

The first reflection plate 40 is arranged between the light collection part 10 and the light diffusion part 20 so as to reflect the light rays collected by the light collection part 10 toward the light diffusion part 20.

The first reflection plate 40 is attached to the inner peripheral surface of the cover part 60 to reflect the light rays coming through the light collection part 10 toward the light diffusion part 20. The first reflection plate 40 may be an aluminum reflection plate.

The second reflection plate 50 is arranged between the light diffusion part 20 and the solar panel 30 so as to reflect the light rays coming through the light diffusion part 20. As shown in FIG. 1, the second reflection plate 50 is curved from the upper side of the solar panel 30 at a given angle with regard to the solar panel 30.

The second reflection plate 50 is provided to prevent the light rays coming in through the light diffusion part 20 from escaping through the upper side of the solar panel 30. The second reflection plate 50 may be an aluminum reflection plate.

The support plate 70 and the first and the second support column 80, 90 are provided to enable a photovoltaic power generation system according to an embodiment of the present invention to be arranged vertically.

The support plate 70 is to support the solar panel 30. The light collection part 10, the light diffusion part 20 and the solar panel 30 are supported on the support plate 70.

The first support column 80 is extended upward from the support plate 70. In the present embodiment, the first support column 80 is extended upward from a corner of the support plate 70.

The second support column 90 is extended downward from the support plate 70. As in the first support column 80, the second support column 90 is extended downward from the corner of the support plate 70 corresponding to the position of the first support column 80.

Figure 5:
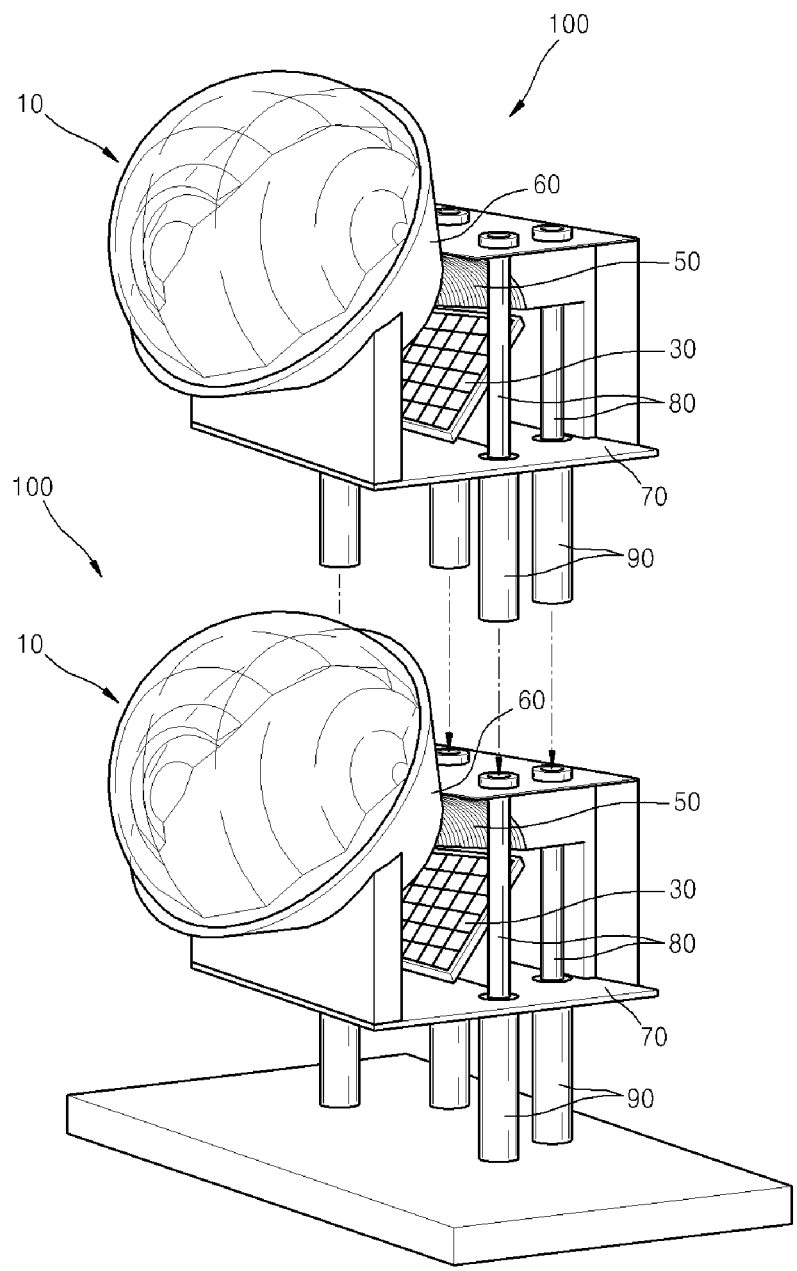
FIG. 5 is a view for illustrating the solar panels vertically arranged in a system for generating photovoltaic power according to an embodiment of the present invention.

The second support column 90 is formed to have an internal cavity for receiving the first support column 80. As shown in FIG. 5, the first support column 80 is inserted in the second support column 90 so as to enable the photovoltaic power generation system to be arranged vertically.

The second support column 90 is so designed that the upper photovoltaic power generation system does not interfere with the light collection part 10 and the second reflection plate 50 of the lower photovoltaic power generation system when the first support column 80 is inserted in the second support column 90.

Thus, the system for generating photovoltaic power according to an embodiment of the present invention includes the light collection part 10 shaped like a dome for collecting light rays and the light diffusion part 20 for diffusing the light rays over the solar panel 30 in order to generate photovoltaic power, so that the collection of light rays is carried out throughout a wide range, and the diffusion of the light rays also throughout a wide range, thereby improving the efficiency of generating power.

Moreover, because the system for generating photovoltaic power according to an embodiment of the present invention uses the light collection part 10 shaped like a dome, there is no need for a device to track the sun's movement. Therefore, the system of the present invention requires reduced cost compared to, and secures the efficiency of generating power no less than, that employing a method of tracking the sun's movement, the sun-tracking method.

In addition, because the system for generating photovoltaic power of the present invention employs refraction of light, it is possible to reduce the overall height of the system, and particularly to obtain a highly compact vertical arrangement of the systems, thereby significantly improving the generation efficiency.

Moreover, the conventional solar panel is made by using reinforced double glass in order to prevent natural disasters, which increases the overall weight of the photovoltaic power generation facility as well as the cost, but the photovoltaic power generation system according to an embodiment of the present invention does not require such reinforced double glass, thus decreasing the cost and the weight.

Furthermore, the photovoltaic power generation system according to an embodiment of the present invention may be arranged vertically so that the generation efficiency per unit area is considerably increased, and the cost for obtaining a wide construction site is eliminated.

Figure 6:
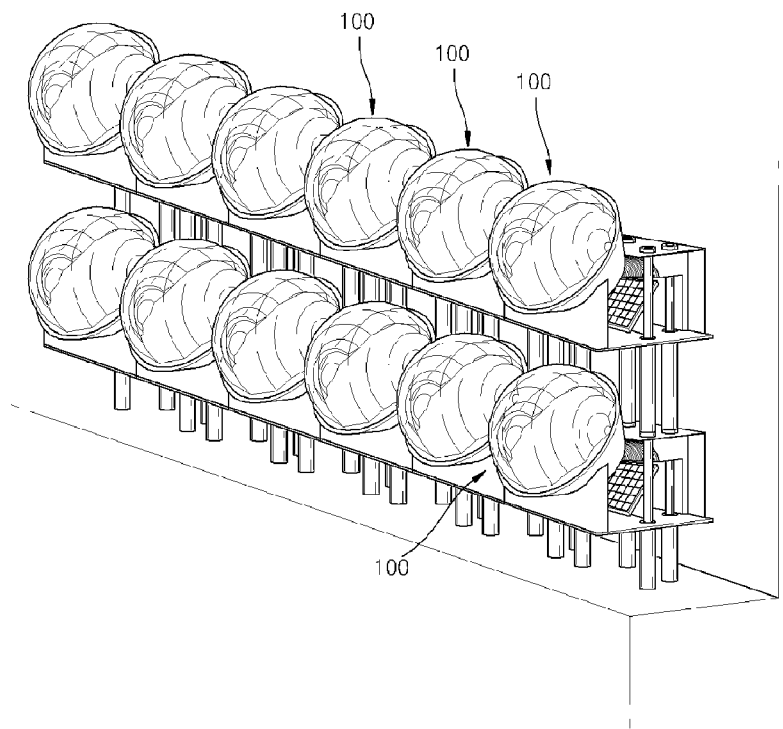
FIG. 6 is a view for illustrating an application of a system for generating photovoltaic power according to an embodiment of the present invention.

Besides, the system of the present invention has no site limitation because of the vertical arrangement. It is possible to install the system in various places such as a building roof, a wall, and a flatland. FIG. 6 illustrates an application of a system for generating photovoltaic power according to an embodiment of the present invention. As shown in FIG. 6, the system is arranged vertically on the rooftop of a building, which provides a high power output sufficiently performing generation of independent power for a building. Also, the present invention eradicates disadvantages of transmitting power when a photovoltaic power generation facility is established in a cheap site such as a desert and a salt farm region which is far-off from urban areas.

Furthermore, the photovoltaic power generation system according to an embodiment of the present invention may be vertically arranged simply by using the support plate 70 and the first and the second support column 80, 90, reducing the number of structural materials used and thus installation cost. Compared to the conventional photovoltaic power generation system of a single-layer type requiring an individual support column, the system of the present invention considerably decreases the number of support columns and thus the cost.

Meanwhile, as described above, the light collection part 10 and the light diffusion part 20 of the present invention may be constructed variously. As shown in FIG. 7, the light condenser lens unit 11 of the light collection part 10 may be formed on the outer surrounding surface of the light collection part 10, and the light diffusion lens unit 21 of the light diffusion part 20 may consist of a plurality of concave lenses combined so as to form a single light diffusion part 20. Besides, as shown in FIG. 8, the solar panel 30 may be formed to have a surface wide enough to receive the light rays diffused by a plurality of light diffusion parts 20.

While the present invention has been described in detail in connection with preferred embodiments, the present invention is not limited by the above embodiments and may be variously modified without departing the scope of the present invention.

DESCRIPTION OF REFERENCE NUMERALS

10 light collection part
11 light condenser lens unit
20 light diffusion part
21 light diffusion lens part
30 solar panel
40 first reflection plate
50 second reflection plate
60 cover part
70 support plate
80 first support column
90 second support column

The invention claimed is:

1. A system for generating photovoltaic power, characterized by including a plurality of modularized unit systems, each modularized unit system comprising:

a light collection part shaped like a dome bulged outward and having a light condenser lens unit for condensing incident light rays;

a light diffusion part having a light diffusion lens unit for diffusing the light rays collected by said light collection part;

a solar panel for receiving the light rays diffused by said light diffusion part;

a support plate for supporting said solar panel;

a support column extending upward from said support plate; and a support column extending downward from said support plate;

wherein said modularized unit systems are vertically stacked so that a support column extending downward from a support plate of an upper modularized unit system is inserted into a support column extending upward from a support plate of a lower modularized unit system.

2. The system for generating photovoltaic power as claimed in claim 1, characterized in that said light condenser lens unit is a convex lens or Fresnel lens formed in an inner surrounding surface of said light collection part.

3. The system for generating photovoltaic power as claimed in claim 1, characterized in that said light condenser lens unit is a convex lens or Fresnel lens formed in an outer surrounding surface of said light collection part.

4. The system for generating photovoltaic power as claimed in claim 1, characterized in that said light diffusion lens unit is one selected from a group of concave lens, prism lens and rod lens.

5. The system for generating photovoltaic power as claimed in claim 1, characterized in that a cover part is arranged between said light collection part and said light diffusion part so as to prevent the light rays collected by said light collection part from escaping outward.

6. The system for generating photovoltaic power as claimed in claim 1, characterized in that a first reflection plate is arranged between said light collection part and said light diffusion part so as to reflect the light rays collected by said light collection part toward said light diffusion part.

7. The system for generating photovoltaic power as claimed in claim 1, characterized in that a second reflection plate is arranged between said light diffusion part and said solar panel so as to reflect the light rays coming through said light diffusion part.

* * * * *